(12) United States Patent
Dobson et al.

(10) Patent No.: US 7,287,212 B2
(45) Date of Patent: Oct. 23, 2007

(54) METHODS AND SYSTEMS FOR VITERBI DECODING

(75) Inventors: Timothy M. Dobson, Cambridge (GB); Sophie Wilson, Cambridge (GB)

(73) Assignee: Broadcom Corporation, Irvine, CA (US)

( * ) Notice: Subject to any disclaimer, the term of this patent is extended or adjusted under 35 U.S.C. 154(b) by 277 days.

(21) Appl. No.: 10/948,545

(22) Filed: Sep. 24, 2004

(65) Prior Publication Data

US 2005/0071735 A1 Mar. 31, 2005

Related U.S. Application Data

(60) Provisional application No. 60/505,862, filed on Sep. 26, 2003.

(51) Int. Cl.
*G06T 15/00* (2006.01)

(52) U.S. Cl. .................. 714/795; 714/786; 709/213

(58) Field of Classification Search ............ 345/589, 345/60, 65, 68, 69, 418; 315/169.1, 169.2, 315/169.3, 169.4; 714/795, 786, 792, 789, 714/788; 709/213; 375/260, 285
See application file for complete search history.

(56) References Cited

U.S. PATENT DOCUMENTS

| | | | | |
|---|---|---|---|---|
| 5,384,810 | A | | 1/1995 | Amrany ...................... 714/786 |
| 5,586,128 | A | * | 12/1996 | Chen ........................... 714/792 |
| 5,786,794 | A | * | 7/1998 | Kishi et al. ................... 345/60 |
| 6,011,355 | A | * | 1/2000 | Nagai ....................... 315/169.3 |
| 6,257,756 | B1 | | 7/2001 | Zarubinsky et al. ......... 714/795 |
| 6,373,451 | B1 | * | 4/2002 | Kang et al. ................... 345/60 |
| 6,757,864 | B1 | * | 6/2004 | Hansquine .................. 714/794 |
| 6,781,322 | B2 | * | 8/2004 | Onozawa et al. ......... 315/169.3 |
| 6,806,655 | B2 | * | 10/2004 | Choi ........................ 315/169.3 |
| 6,883,021 | B2 | | 4/2005 | Ahmed et al. .............. 709/213 |
| 6,901,118 | B2 | * | 5/2005 | Hocevar et al. ............. 375/341 |
| 6,963,174 | B2 | * | 11/2005 | Lee et al. ................. 315/169.3 |
| 7,027,010 | B2 | * | 4/2006 | Lee .............................. 345/60 |
| 2005/0071735 | A1 | | 3/2005 | Dobson et al. .............. 714/795 |

OTHER PUBLICATIONS

Hekstra, Andries P., "An Alternative to Metric Rescaling in Viterbi Decoders," IEEE Trans. Comm. vol. 37. No. 11, Nov. 1989, pp. 1220-1222.
Viterbi, A. J., "Error Bounds for Convolutional Codes and an Asymptotically Optimum Decoding Algorithm," IEEE Trans. Inf. Theory, Apr. 1967, pp. 260-269.
DSP56300 manual, Motorola, pp. 3-4 and 4-7, May 1999.
U.S. Appl. No. 10/948,544, "Methods and Systems for Viterbi Decoding,".

* cited by examiner

*Primary Examiner*—Phu K. Nguyen
(74) *Attorney, Agent, or Firm*—Sterne Kessler Goldstein & Fox, P.L.L.C.

(57) ABSTRACT

An execution unit and method for performing Viterbi decoding is provided. The instruction may be built into an execution unit which executes other instructions, or in its own execution unit. In an example implementation, the instruction is used in implementing the central-office modem (ATU-C) of an asymmetric digital subscriber line ("ADSL") system. In the example implementation, the new instruction takes as input eight input metrics and eight state metrics, and returns as output eight updated state metrics and eight decision bytes. The decision bytes contain: two 'path' bits to enable the previous state to be quickly identified; bits to enable the input bits to be quickly identified; and a carry bit to allow the full value of a state metric to be reconstructed, even though during the calculation only the bottom bits are calculated.

6 Claims, 9 Drawing Sheets

METHODS AND SYSTEMS FOR VITERBI DECODING

This application claims the benefit of priority to U.S. Provisional Patent Application No. 60/505,862, filed Sep. 26, 2003, which is incorporated herein by reference in its entirety

BACKGROUND OF THE INVENTION

1. Field of the Invention

The invention relates to decoding convolutional codes and, more particularly, to Viterbi decoding.

2. Related Art

A convolutional code is a type of error correcting code that is routinely used for reliable communications of digital data over a noisy channel. Convolutional codes are, for example, commonly used within telecommunications applications, such as digital subscriber line ("DSL"), wireless 802.11, and ultra-wide band applications.

Viterbi decoding is one method of decoding data streams that have been encoded with a convolutional encoder. Viterbi decoding performs optimal error correction for a given code to improve coding gain and produce reliable results at a digital receiver. To achieve a high level of performance, Viterbi decoding requires significant processing time because for each decode step it performs a calculation for each possible state of the encoder.

In older designs for decoders, a data stream flows though fixed-function hardware circuits that include the logic to perform Viterbi decoding. However, to provide greater flexibility with respect to decoder development, it has become more common to use software to perform the various functions in a decoder. Unfortunately, implementation of the Viterbi decoding algorithm in software is a complex calculation. As a result, when using conventional instructions (e.g., add, compare, select, etc) it may take many cycles to decode a single data symbol.

Given the growing consumer demand for high speed communications, such as DSL services, one processor within a DSL modem may need to handle several megabits per second. The Viterbi decode process for each symbol can therefore represent a significant proportion of the total computational cost of the modem. With increasing workloads (in terms of total data traffic passing through such a modem), it becomes necessary to improve the efficiency of the Viterbi decode process.

What is needed are methods and systems for efficiently implementing a Viterbi decoder.

SUMMARY OF THE INVENTION

An execution unit and method for performing Viterbi decoding is provided. The instruction may be built into an execution unit which executes other instructions, or in its own execution unit. In an example implementation, the instruction is used in implementing the central-office modem (ATU-C) of an asymmetric digital subscriber line ("ADSL") system. In the example implementation, the new instruction takes as input eight input metrics and eight state metrics, and returns as output eight updated state metrics and eight decision bytes. The decision bytes contain: two 'path' bits to enable the previous state to be quickly identified; bits to enable the input bits to be quickly identified; and a carry bit to allow the full value of a state metric to be reconstructed, even though during the calculation only the bottom bits are calculated. The instruction may employ modulo arithmetic.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing summary and the following detailed description are exemplary and explanatory and are intended to provide further explanation of the invention as claimed.

BRIEF DESCRIPTION OF THE DRAWINGS/FIGURES

The present invention will be described with reference to the accompanying drawing.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

A convolutional code is a type of error correcting code that is routinely used for reliable communications of digital data over a noisy channel. A convolutional code accepts k binary symbols at its input and produces n binary symbols at its output, where the n output symbols are affected by v+k input symbols. Memory is incorporated into a convolutional code since v>0.

Convolutional codes are commonly specified by three parameters (n, k, m), where n equals the number of output bits, k equals the number of input bits and m equals the number of memory registers. The quantity k/n is referred to as the code rate, and is a measure of the efficiency of the code. Common values for k and n range from 1 to 8 with code rates typically ranging from ⅛ to ⅞. In exceptional cases, code rates can be as low as 1/100 or lower for deep space communication applications.

Figure 1:
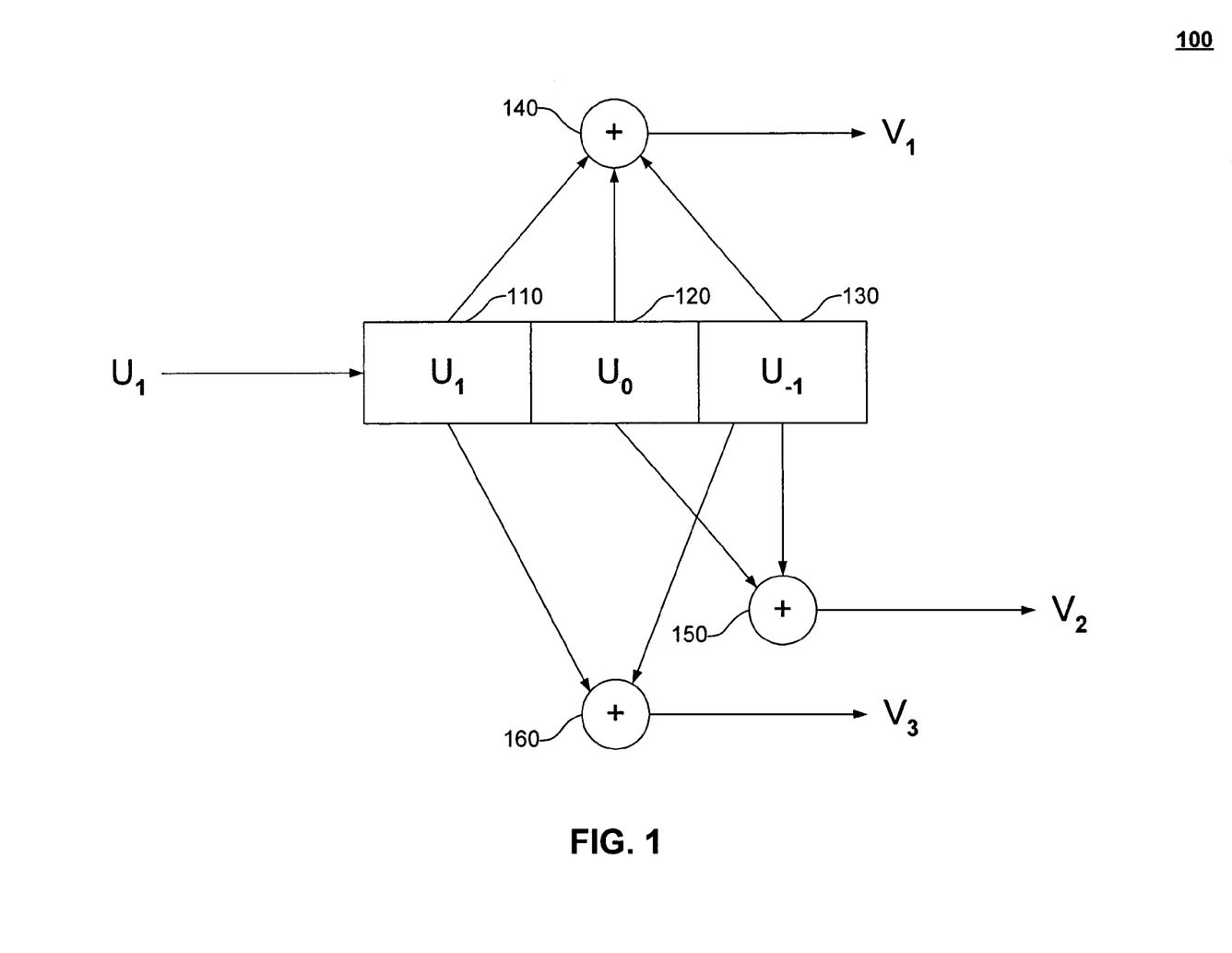
FIG. 1 is a diagram of a convolutional encoder.

FIG. 1 shows a convolutional encoder 100. Convolutional encoder 100 has three memory registers 110, 120 and 130, an input bit, $u_1$, and three output bits $v_1$, $v_2$, and $v_3$. Convolutional encoder 100 includes three modulo-2 adders 140, 150, and 160 that produce output bits, $v_1$, $v_2$, and $v_3$, respectively, by adding up certain bits in the memory registers 110, 120 and 130. In particular, modulo-2 adder 140 is coupled to memory registers 110, 120, and 130. Modulo-2 adder 150 is coupled to memory registers 120 and 130. Modulo-2 adder 160 is coupled to memory registers 110 and 130. The selection of which memory registers are coupled to a particular modulo-2 adder is a function of a generator polynomial for each output bit. In this example, the generator polynomials are $v_1 = \text{mod } 2(u_1+u_0+u_{-1})$, $v_2 = \text{mod } 2(u_0+u_{-1})$ and $v_3 = \text{mod } 2 (u_1+u_{-1})$, where $u_1$ is the current input bit at time t, $u_0$ is the input bit from time t−1 and $u_{-1}$ is the input bit from time t−2.

Figure 2:
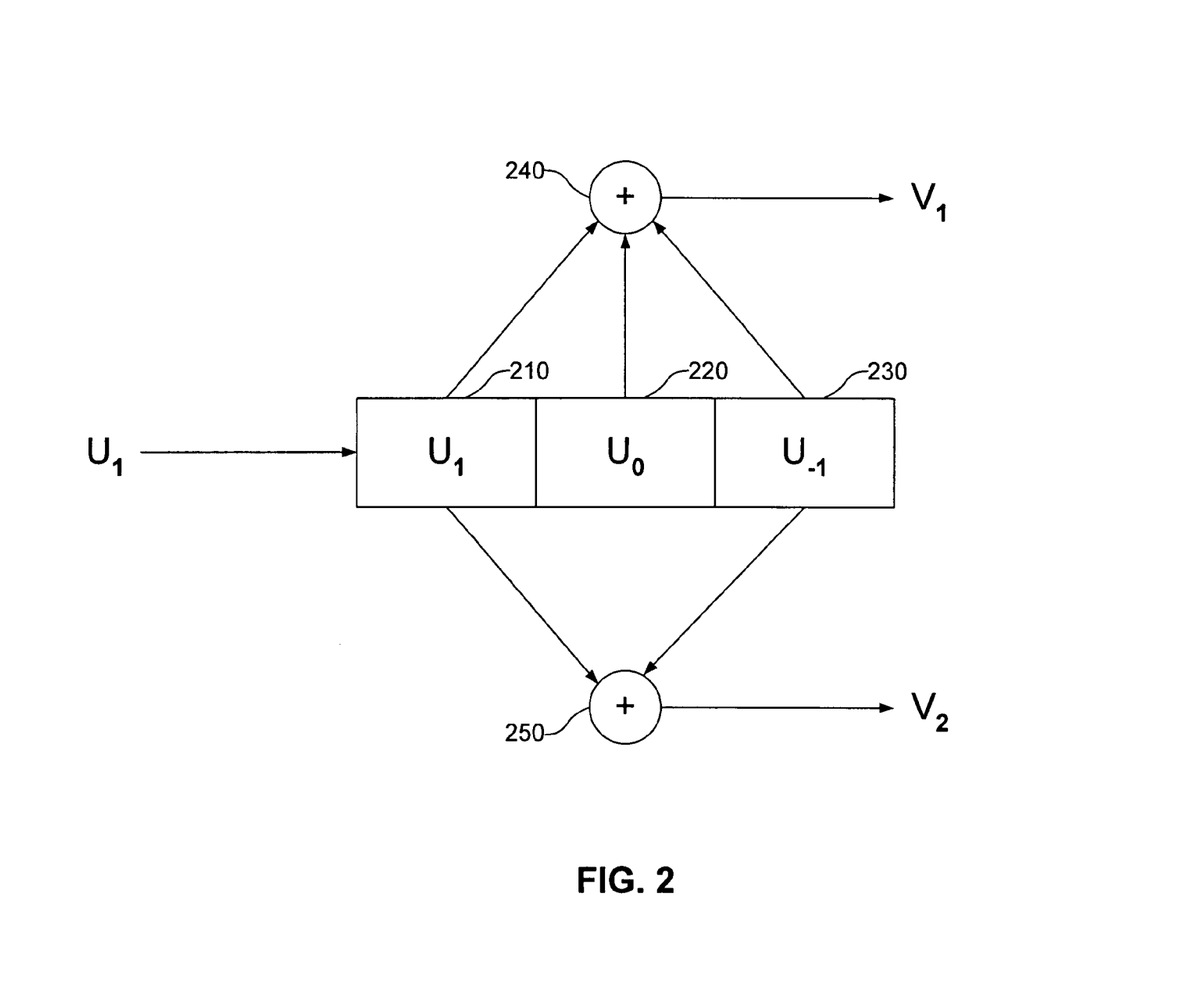
FIG. 2 is a diagram of a convolutional encoder.

A trellis diagram can be used to describe how a convolutional encoder operates. FIG. 2 shows another simplified example of a convolutional encoder that will be used to demonstrate the use of a trellis diagram. Convolutional encoder 200 depicted in FIG. 2 has three memory registers 210, 220 and 230, input bit, $u_1$, and two output bits $v_1$ and $v_2$. Convolutional encoder 200 includes two modulo-2 adders 240 and 250 that produce output bits, $v_1$ and $v_2$, respectively, by adding up certain bits in the memory registers 210, 220 and 230. Modulo-2 adder 240 is coupled to memory registers 210, 220 and 230. Modulo-2 adder 250 is coupled to memory registers 210 and 230. In this example, the generator polynomials are $v_1 = \text{mod } 2(u_1+u_0+u_{-1})$, $v_2 = \text{mod } 2(u_0+u_{-1})$, where $u_1$ is the current input bit at time t, $u_0$ is the input bit from time t−1 and $u_{-1}$ is the input bit from time t−2.

Figure 3:
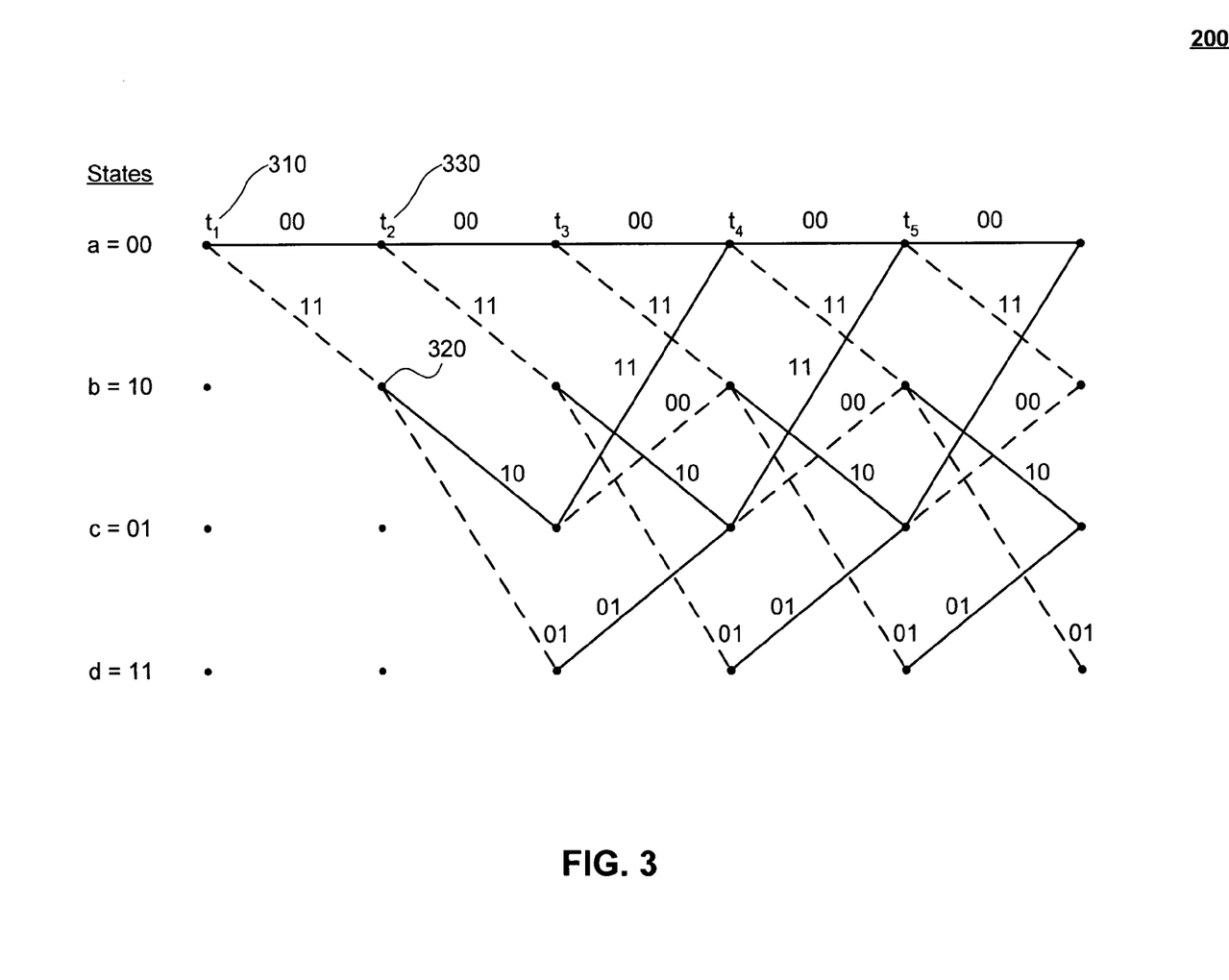
FIG. 3 is a trellis diagram.

FIG. 3 shows a trellis diagram 300 for convolutional encoder 200. A trellis diagram can be used to show the output and state of a convolutional encoder based on the input received and the immediate prior state of a convolutional encoder. For example, referring to FIG. 3, at time $t_1$, the state of convolutional encoder 200 is assumed to be a=00. In other words, memory registers 220 and 230 both contain the value of 0. On trellis diagram 300 when the input bit is 0, a solid line is used to connect a point in the trellis diagram to a next point at time t+1. Similarly, when an input bit is 1, a dashed line is used to connect a point in the trellis diagram to a next point at time t+1.

Referring to trellis diagram 300, when an input bit of 1 is received at time t1, convolutional encoder 200 outputs 11 and the state of convolutional encoder 200 moves to b=10. This is represented on trellis diagram 300 by the dashed line from point 310 to point 320. The "11" over the dashed line shows the output of convolutional encoder 200. At point 320, trellis diagram 300 shows that at time $t_2$, convolutional encoder 200 has a state of b=10. Alternatively, while at $t_1$ when an input bit of 0 is received, convolutional encoder 200 outputs a 00 and the state of convolutional encoder 200 stays at a=00. This transition is represented by the solid line from point 310 to point 330. The "00" over the solid line shows the output of convolutional encoder 200. At point 330, trellis diagram 300 also shows that at time $t_2$, convolutional encoder 200 has a state of b=00. Trellis diagram 300 shows all potential states for convolutional encoder 200 and possible transitions for six time cycles.

Once the outputs, or codewords, are generated they are transmitted to a receiver over a communication channel, which may be a wired or wireless communication channel. In either case, noise within the channel or other impairments may lead to errors within the transmitted signal. Thus, the received codeword may be different from the transmitted codeword. A decoder at the receive end of a communications link must then make an estimate to determine what was the actual transmitted codeword.

For example, at the receiving end of a transmission, a decoder must interpret the transmitted signal by decoding the encoding signal to obtain the information that is being transmitted for use. This information, for example, might represent data used to display a web page transmitted over a DSL connection between an end user and a central telephone switching office.

A common decoding algorithm for convolutional codes is the Viterbi decoding algorithm. Viterbi decoding is described in, for example, *Error Bounds for Convolutional Codes and an Asymptotically Optimum Decoding Algorithm*, A J Viterbi, IEEE Trans. Inf. Theory, IT-13, pp 260-269, April 1967, incorporated herein by reference in its entirety. The Viterbi algorithm essentially performs maximum likelihood decoding. The algorithm involves calculating a measure of similarity, (which can also be referred to as a distance or decision value), between the received signal, at time $t_i$, and all the trellis paths entering each state at time $t_i$. The Viterbi algorithm removes from consideration those trellis paths that could not possibly be candidates for the maximum likelihood choice. When two paths enter the same state, the one having the best metric is chosen. This path is referred to as the surviving path.

Viterbi decoding performs optimal error correction for a given code, but it is particularly expensive because for each decode step it performs a calculation for each possible state of the encoder. A Viterbi decode step takes as input a (typically) small number of input metrics and a (typically) larger number of state metrics, and outputs new values for the state metrics and a decision or path value (i.e., a measure of similarity) for each state. The metrics are typically four to sixteen bits in size, and the path values have the same number of bits that the convolutional code consumes on each step.

The Viterbi decoding algorithm can be illustrated by the following example. Assume that convolutional encoder 200 received an input data sequence, n, and transmitted a series of codewords, T. A Viterbi decoder received the transmitted code words as a received sequence R as illustrated below.

| Time: | $t_1$ | $t_2$ | $t_3$ | $t_4$ | $t_5$ |
|---|---|---|---|---|---|
| n: | 1 | 1 | 0 | 1 | 1 |
| T: | 11 | 01 | 01 | 00 | 01 |
| R: | 11 | 01 | 01 | 10 | 01 |

Figure 4A:
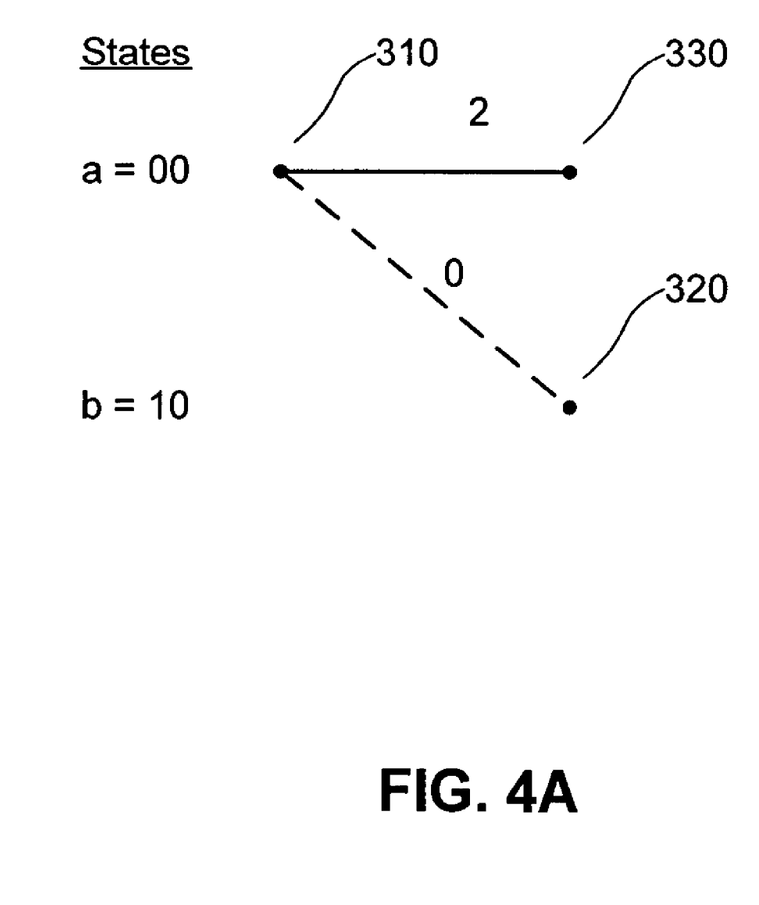
FIG. 4A is a trellis diagram at time $t_2$ provided to demonstrate implementation of the Viterbi decoding algorithm.

At the receiving end of the signal, the decoder does not know whether the signal is correct or whether it has been subject to some form of impairment thereby generating an error. At each time interval, a metric of similarity between the received codeword and the possible codewords is generated. The possible codewords are known based on knowledge of the type of convolutional code. In the above example, trellis diagram 300 shows the two possible paths to be from point 310 to point 330 (hereinafter, paths will be abbreviated in the form of "path 310-330") or from point 310 to point 320. These are illustrated in FIG. 4A.

The similarity metric for path 310-330 is 0, while the similarity metric for path 310-320 is 2. The similarity metric is computed by comparing the received codeword to the possible output codeword shown in trellis diagram 300 for the path. For path 310-330, trellis diagram 300 shows the possible transmitted codeword to be 00. Recall that the received codeword is 11, thus the similarity metric is 2. The similarity metric is computed by determining the difference between the received codeword and the possible transmitted codeword. The higher the similarity metric the less likely the received codeword is actually the transmitted codeword. Within the Viterbi algorithm, when two paths in the trellis merge to a single state, the path with the highest similarity metric is removed. At time $t_2$ in the present example, no paths have merged to a single state, so additional data must be examined before any decisions on what the received signal actually is can be made.

Figure 4B:
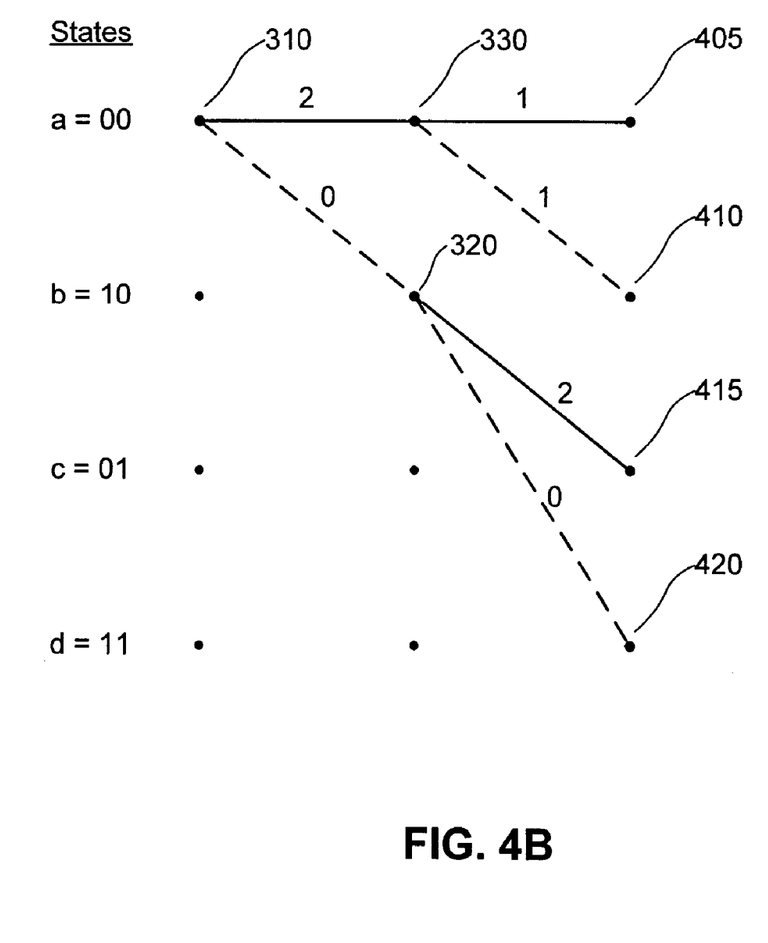
FIG. 4B is a trellis diagram at time $t_3$ provided to demonstrate implementation of the Viterbi decoding algorithm.

FIG. 4B provides a portion of trellis diagram 300 showing the potential paths after time $t_3$. Referring to FIG. 4B, there are four possible paths: path 310-330-405, path 310-330-410, path 310-320-415 and path 310-320-420. A similarity metric can be computed for each path, such that Path 310-330-405 has similarity metric equal to 3. Path 310-330-410 has a similarity metric equal to 3. Path 310-320-415 has a similarity metric equal to 2. Path 310-320-420 has a similarity metric equal to 0. Once again because no paths have converged to a single state, no decisions can be made with respect to what codeword an encoder would estimate to be the transmitted codeword.

Figure 4C:
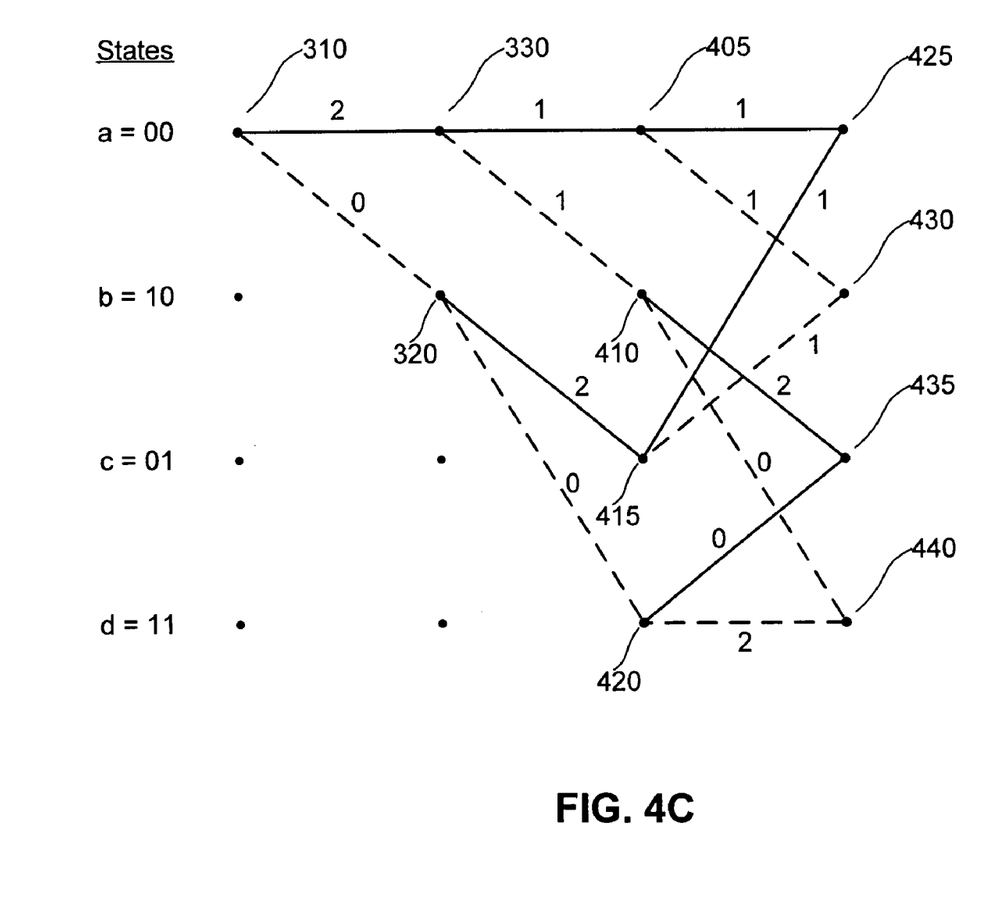
FIG. 4C is a trellis diagram at time $t_4$ provided to demonstrate implementation of the Viterbi decoding algorithm.

FIG. 4C provides a portion of trellis diagram 300 showing the potential paths after time $t_4$. Referring to FIG. 4C, there are eight possible paths. These paths and their similarity metrics are shown below.

| Path | Similarity Metric |
|---|---|
| Path 310-330-405-425 | 4 |
| Path 310-330-410-435 | 5 |
| Path 310-330-410-440 | 3 |
| Path 310-330-405-430 | 4 |
| Path 310-320-415-425 | 3 |
| Path 310-320-415-430 | 3 |
| Path 310-320-420-435 | 0 |
| Path 310-320-420-440 | 2 |

In this case several of the paths converge to the same state. For example Path 310-330-405-425 and Path 310-320-415-425 both converge at point 425. In this case, the similarity metrics are compared for these two paths and the path with the highest similarity metric is removed from consideration. Thus, because Path 310-330-405-425 has a similarity metric that is higher than that of Path 310-320-415-425, Path 310-330-405-425 is eliminated from consideration. This process can be done for each of the pairs of paths that converge on a single state. Upon completion of the process in this example, all remaining paths have the stem of Path 310-320. As a result, the Viterbi decoding algorithm would conclude that the transmitted codeword for time $t_1$ was 11.

The example provided through FIGS. 3 and 4 demonstrates how quickly the Viterbi decoding algorithm can become complex even for a simple convolutional encoder with a limited number of states. The challenges of decoding a received signal that has been encoded using convolutional coding varies by the application, the speed of transmission and the type of convolutional coding. In general, however, improvements are needed to more efficiently decode signals using an implementation of the Viterbi decoding algorithms. The present invention provides an execution unit, method and instructions that address this need.

The above examples of Viterbi coding involved what is referred to as "hard decision" Viterbi decoding. Another related approach to Viterbi decoding is "soft decision" decoding, which takes into account the analog nature of an input. The implementation examples described below use "soft decision" decoding. However, the scope of invention is not limited to "soft decision" decoding, and can be applied to hard decision decoding, as will be known by individuals skilled in the relevant arts based on the teachings herein.

The invention is described in the context of an example implementation. The invention is not, however, limited to the example implementation. Based on the teachings herein, individuals skilled in the relevant arts will be able to apply the present invention to other applications, such as other forms of DSL, 802.11 wireless applications and ultra-wide band wireless applications, for example.

In the example implementation, the present invention is used in implementing a central-office modem (ATU-C) of an asymmetric digital subscriber line ("ADSL") system. ADSL provides high speed broadband communications typically from a telephone central office switch location to a user premises (e.g., a home or business). ADSL provides for sending and receiving high-speed data over existing copper telephone lines at high data rates. ITU-T Standards G.992.1, G.992.3 and G.992.4 specify industry standards for ADSL.

These standards specify a common scheme for mapping a set of input data bits $U=\{u_1, u_2, \ldots, u_z\}$ and input state bits $S=\{S_0, S_1, S_2, S_3\}$ onto two sets of output data bits $V=\{v_0, v_1, \ldots, v_{x-1}\}$, $W=\{w_0, w_1, \ldots, w_{y-1}\}$ and output state bits $S'=\{S'_0, S'_1, S'_2, S'_3\}$. V and W are then quadrature amplitude modulation ("QAM")-encoded onto a pair of discrete multitone ("DMT") tones, with x-bit and y-bit constellations respectively. Typically, $z=x+y-1$. The process is then repeated with S' forming the input state for the next pair of tones, and so on.

The equations governing the output are as follows:

$$v_0 = u_3$$
$$v_1 = u_1 \wedge u_3$$
$$v_n = u_{n+2}, \quad \text{for } n = 2 \text{ to } (x-1)$$

$$w_0 = u_2 \wedge u_3$$
$$w_1 = S_0 \wedge u_1 \wedge u_2 \wedge u_3$$
$$w_n = u_{n+x}, \quad \text{for } n = 2 \text{ to } (y-1)$$

$$S'_0 = S_1 \wedge S_3 \wedge u_1$$
$$S'_1 = S_2 \wedge u_2$$
$$S'_2 = S_0$$
$$S'_3 = S_1$$

where '∧' represents the logical exclusive-OR operation.

Figure 5:
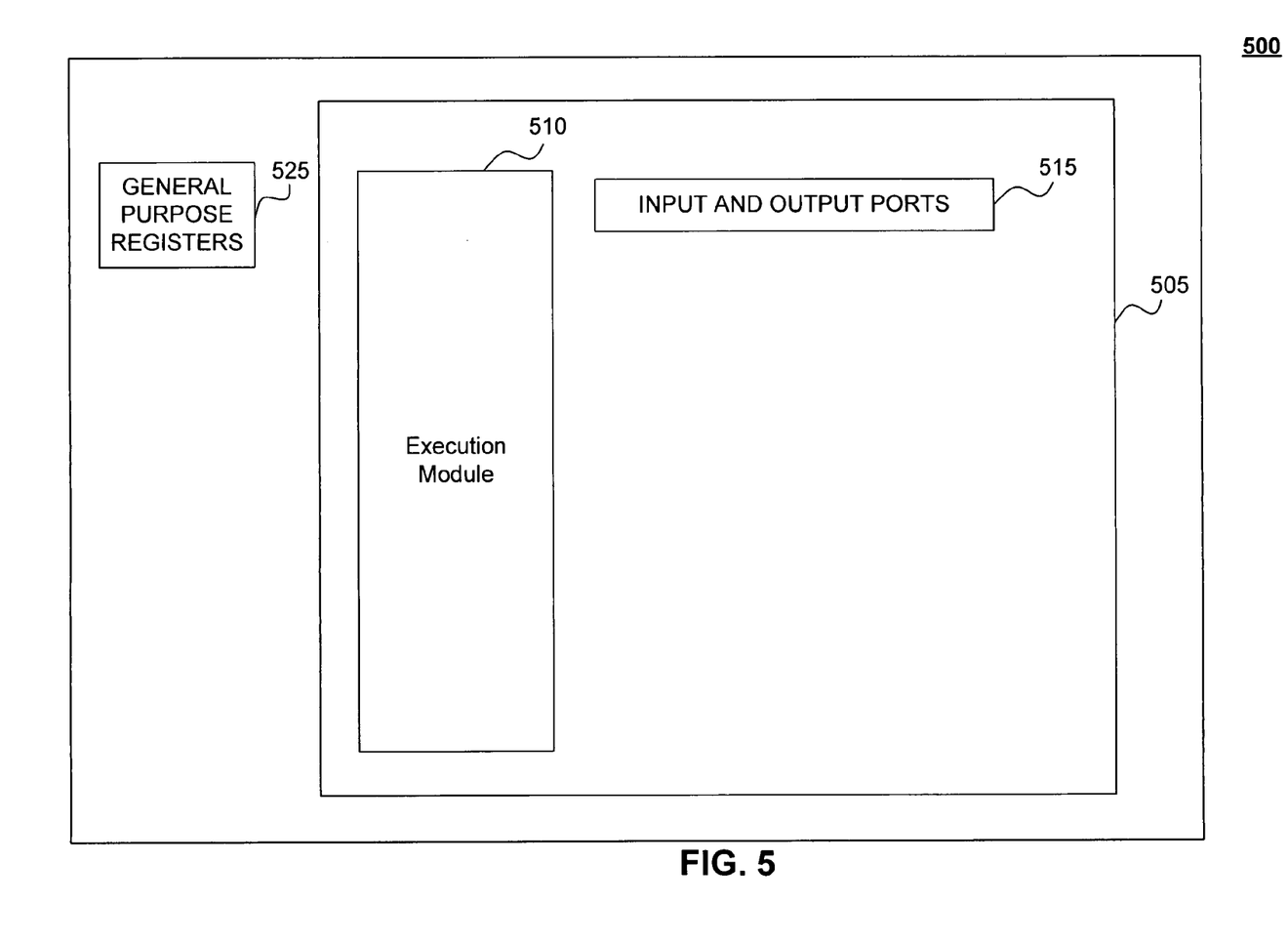
FIG. 5 is a diagram of a processor with an execution unit for Viterbi decoding, according to an embodiment of the invention.

FIG. 5 is a diagram of a portion of a processor 500. Processor 500 includes execution unit 505 and general purpose registers 525. Execution unit 505 includes an execution module 510 and input and output ports 515. Execution module 510 contains the instruction necessary to perform a Viterbi decode using the approach presented herein. Execution module 510 performs this instruction, referred to as AVIT below, accesses information needed for the instruction that are located in the registers and stores results in the registers so they may be used by other instructions and processes within a decoder.

Processor 500 can be located within a decoder used to decode codewords generated by a convolutional encoder. Execution unit 505 can be built with hardware, software or a combination of hardware and software. Execution unit 505 can be included in processor 500 as illustrated in FIG. 5, or in other types of general purpose hardware as will be known to individuals skilled in the relevant arts. General purpose registers 525 are 64 bit general purpose registers. General purpose registers 525 are used to hold state metrics, input metrics and decision values generated and used by the AVIT instruction. When used to hold state metrics, a general purpose register is referred to as a state register. When used to hold input metrics, a general purpose register is referred to as a input register. When used to hold decision values, a general purpose register is referred to as a decision value register. Data between execution unit 505 and general purpose registers 525 is exchanged through input and output ports 515.

Figure 6:
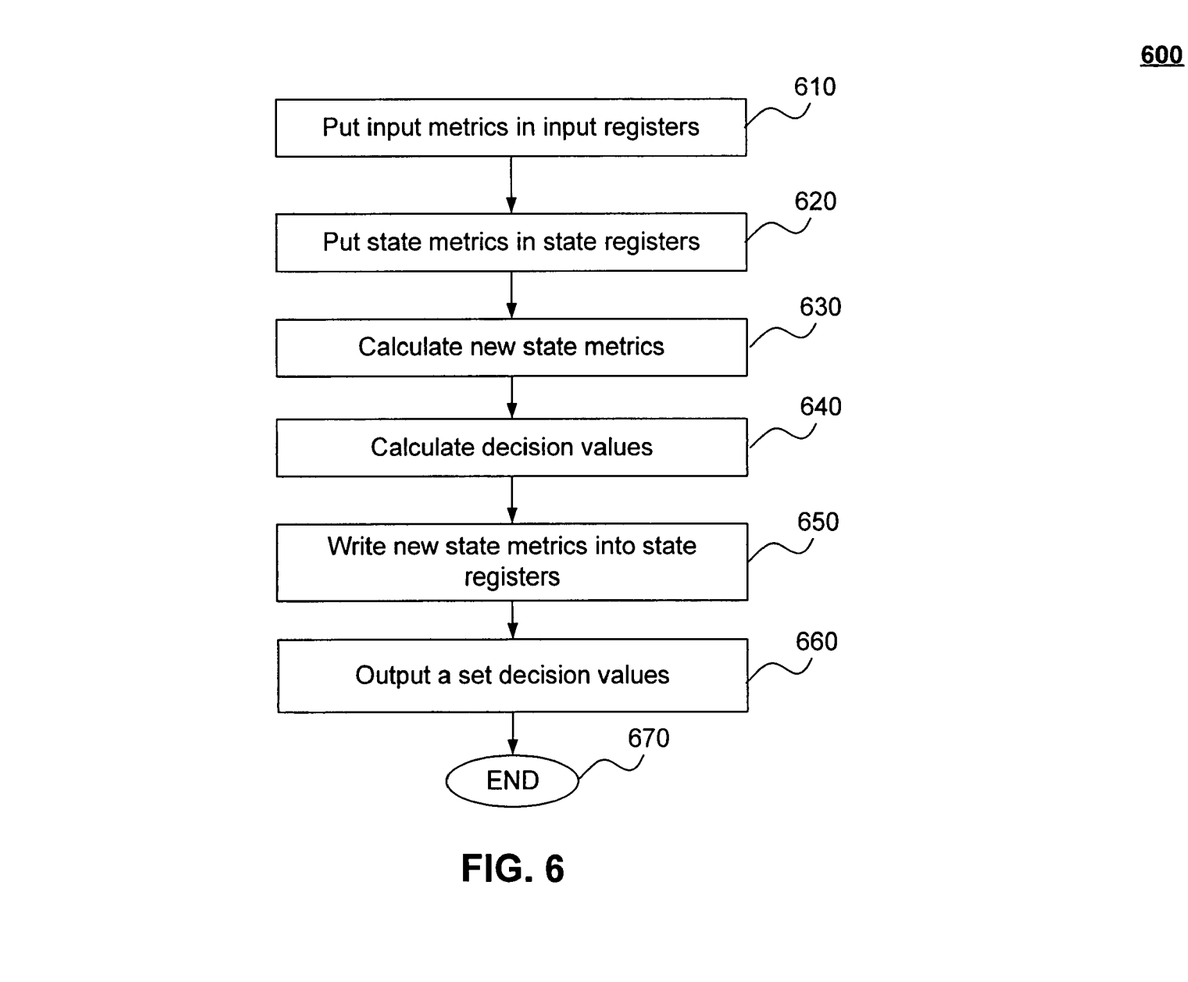
FIG. 6 is a flowchart of a method for generating state metrics and decision values used to implement the Viterbi decoding algorithm, according to an embodiment of the invention.

FIG. 6 is a flowchart of a method 600 for generating state metrics and decision values used to implement a Viterbi decoding algorithm. Method 600 begins in step 610. In step 610 input metrics are placed into input metric registers, such as general purpose registers 525. In step 620 state metrics are placed into state metric registers, such as general purpose registers 525. In step 630 new state metrics are calculated. These metrics can be calculated using an AVIT command as The following is a description of AVIT decisions, states, and input_metrics. In the following definition:

States[i] is the i'th byte in states; similarly for decision[i] and input_metrics[i]

states_in[i] is the value of states before the instruction is issued states_out[i] is the value of states after the instruction completes & is bitwise AND, | is bitwise OR MIN(a,b) is defined as if((a−b)&0×80) then a otherwise b. (modulo arithmetic minimum).

WHICHMIN(a,b) is defined as if((a−b)&0×80) then 0 otherwise 1.

MIN(a,b,c,d) is defined as the value X out of a,b,c,d for which WHICHMIN(X,Y) is 0 for all Y≠X in {a,b,c,d}. If none of a,b,c or d satisfies this, the implementation may do whatever is most convenient to implement, since this should not occur in practice.

MSB(x) is the most significant bit of x.

AVIT performs the following calculation:

```
candidate(i,j) = (states_in[i]+input_metrics[j]) (a nine bit value)
A0=candidate(0,0)   B0=candidate(1,1)   C0=candidate(2,2)   D0=candidate(3,3)
A1=candidate(0,2)   B1=candidate(1,3)   C1=candidate(2,0)   D1=candidate(3,1)
A2=candidate(0,1)   B2=candidate(1,0)   C2=candidate(2,3)   D2=candidate(3,2)
A3=candidate(0,3)   B3=candidate(1,2)   C3=candidate(2,1)   D3=candidate(3,0)
A4=candidate(4,4)   B4=candidate(5,5)   C4=candidate(6,6)   D4=candidate(7,7)
A5=candidate(4,6)   B5=candidate(5,7)   C5=candidate(6,4)   D5=candidate(7,5)
A6=candidate(4,5)   B6=candidate(5,4)   C6=candidate(6,7)   D6=candidate(7,6)
A7=candidate(4,7)   B7=candidate(5,6)   C7=candidate(6,5)   D7=candidate(7,4)
    FOREACH i in 0..7
  states_out[i] = (MIN(A<i>,B<i>,C<i>,D<i>))&0xff
  if(states_out[i]==A<i>) decisions[i] =0     | MSB(A<i>)
  if(states_out[i]==B<i>) decisions[i] =0x44 | MSB(B<i>)
  if(states_out[i]==C<i>) decisions[i] =0x28 | MSB(C<i>)
  if(states_out[i]==D<i>) decisions[i] =0x6C | MSB(D<i>)
``` is described below. In step 640 decision values are calculated. These decision values can be calculated using an AVIT command as is described below.

The decision values can include two path bits to enable the previous state to be identified. They can also include bits to enable the input bits to be identified. Additionally, the decision values can include a carry bit to allow the full value of a state metric to be reconstructed. Even during a calculation only the bottom bits are calculated. This is useful because the value of state metric 0 at the end of the calculation can be used as a measure of noise. The carry bit for a particular state is equal to the carry bit of the sum which was selected as the minimum for that state.

In step 650 the new state metrics are written to state registers, such as general purpose registers 525. In step 660 the decision values generated in step 640 are output. In step 670, method 600 ends.

In method 600, the following instruction can be used for steps 630 through 660 to generate new state metrics and decision values. The instruction, referred to as AVIT, takes as input eight input metrics and eight state metrics, and returns as output eight updated state metrics and eight decision bytes. AVIT takes three 64 bit operands—one input, one in/out and one output. Although writing the new state metrics back to the state registers can be considered as a separate step, part of the benefit of the AVIT instruction is that there is no separate instruction to be issued after the AVIT instruction for writing the new state metrics back to the state registers.

The evaluation order of the four if statements above is arbitrary, in that although it can affect the output of the Viterbi algorithm, no particular choice is better than any other in terms of the error rate in the output. In the particular implementation, the evaluation order is as above. That is, if more than one A<i>, B<i>, C<i>, D<i> is equal to states_out[i], the last determines the value of decisions[i].

Each decision[i] output includes:

Bit 0—A value which can be used for reconstruction of the upper bits of the final state metrics.

Bits 2 . . . 3—A value encoding the path selected for state <i> in this decode step.

Bits 4 . . . 5—A value useful for calculating bits u1 and u2 of the symbol which are most likely if the encoder was in state <i>. The actual value may be obtained simply by 'exclusive-or'ing these bits with a value in a constant table indexed by <i>.

The positions of these bits are arbitrary. A number of other encodings are possible. The AVIT instruction may employ modulo arithmetic to avoid the necessity to rescale the state metrics, as described in, "An alternative to metric rescaling in Viterbi Decoders", Andries P Hekstra, IEEE Trans Comm Vol 37 no 11, pp 1220-1222, November 1989, incorporated herein by reference in its entirety. Hekstra demonstrated that the input/output behavior of the Viterbi algorithm is unaffected by the application of a modulo operator to all metric variables, when the range of the modulo operator is sufficiently large and approximately symmetric around zero. Hekstra further observed that this modulo operator corresponds to the overflow mechanism in two's complement arithmetic and therefore has no hardware cost.

Figure 7:
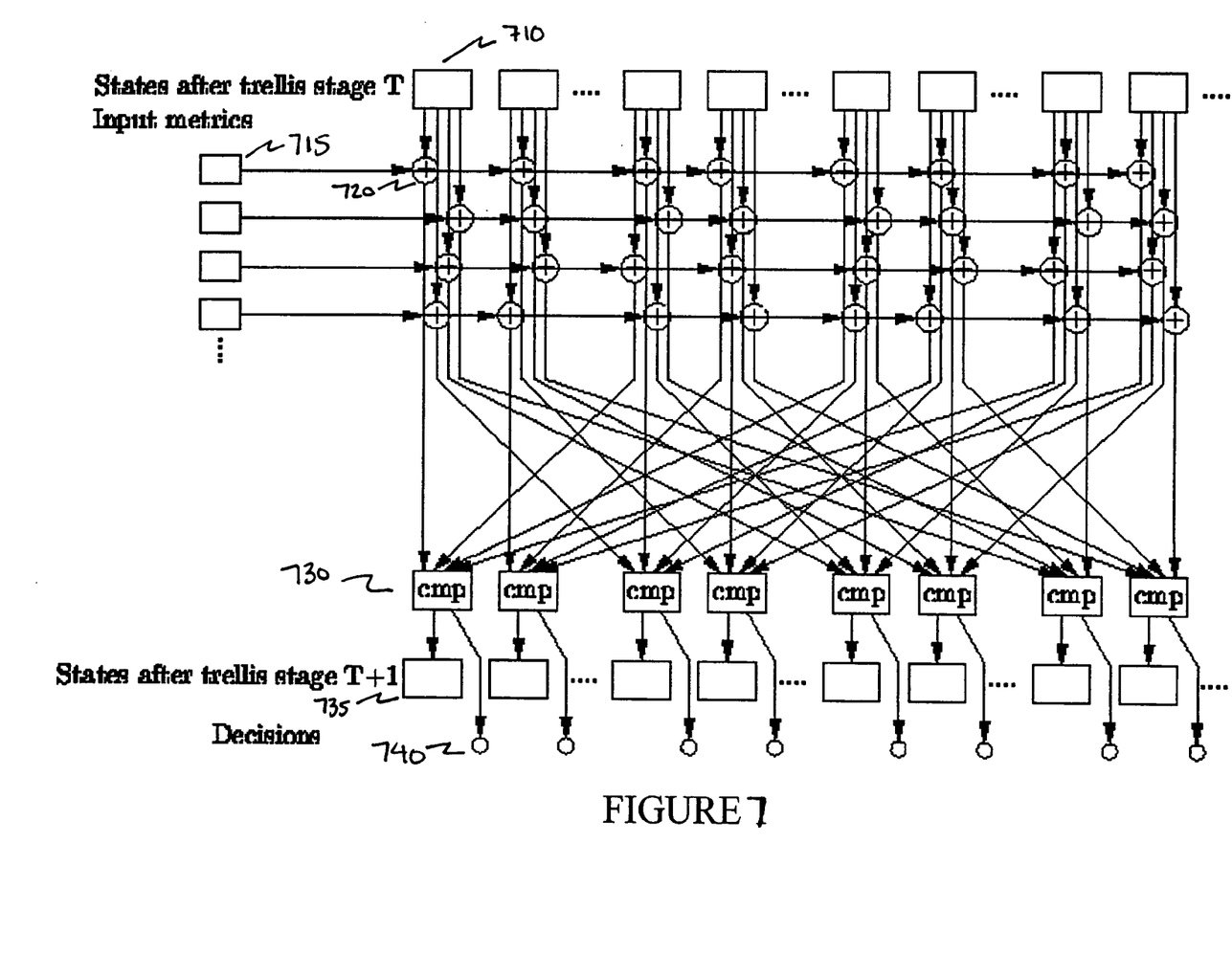
FIG. 7 is a diagram of a Viterbi decode computation, according to an embodiment of the invention.

FIG. 7 provides a diagram showing the implementation of one stage of a Viterbi decode computation for ADSL. In particular, state metrics 710 represent a state of an encoder at time T. A value is generated by adding state metrics 710 with input metrics 715 at adder 720, possibly through the use of modulo arithmetic. This value is provided to compare module 730. Compare module 730 computes a four way minima of values provided from other combinations of state and input metrics. Compare module 730 produces an output that represents a new value for state metrics 710, which is indicated in the diagram by state metrics 735. This represents state metrics 710 at time T+1. Additionally, compare module 730 provides decision 740 which is a decision value that can be used by the execution unit to determine the most likely path within a trellis diagram and ultimately to estimate the value of a transmitted codeword.

The present invention can be used to decode signals received by an ADSL modem. In ADSL 16 states are processed. AVIT processes eight states, so it is used twice to perform one ADSL Viterbi decode step. The two command are issued as follows:

AVIT decisions0 . . . 7, states0 . . . 7, metrics0 . . . 7
AVIT decisions8 . . . 15, states8 . . . 15, metrics8 . . . 15

ADSL standards define only 8 input metrics corresponding to 8 possible values of the 3 output bits of the convolutional code used for ADSL. These are supplied in two different orders to the two instances of AVIT. Specifically input values 2,6,0,4,3,7,1,5 are used for metrics 0 . . . 7 and input values 0,4,2,6,1,5,3,7 are used for metrics 8 . . . 15.

The values supplied in states 0 . . . 7 should be state metrics corresponding to, in order, values of the state equal to: 0,4,8,12,1,5,9,13. The values supplied in states 8 . . . 15 should be state metrics corresponding to, in order, values of the state equal to: 2,6,10,14,3,7,11,15

The values in states 0 . . . 7 and states 8 . . . 15 after both AVIT instructions have completed are state metrics corresponding to values of the state equal to 0 . . . 7, 8 . . . 15. These orderings used by the specific implementation are arbitrary, except that it is necessary to include in the inputs to each instruction all those inputs which are required to produce a given output. Upon completion of the execution of the AVIT instructions, decision values can be provided to determine the transmitted codeword.

CONCLUSIONS

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An execution unit for performing a Viterbi decoding algorithm within a processor having general purpose registers, comprising an execution module including an AVIT instruction that determines updated state metrics and decision values for the Viterbi decoding algorithm, wherein said AVIT instruction comprises:

receiving eight input metrics and eight state metrics, wherein an input metric is represented as input metrics [j], wherein a state metric is represented as states_in[i];
calculating candidates(i,j)=(states_in[i]+input_metrics [j]), wherein candidates (i,j) is a nine bit value, wherein A0=candidate(0,0)     B0=candidate(1,1)
A1=candidate(0,2)     B1=candidate(1,3)
A2=candidate(0,1)     B2=candidate(1,0)
A3=candidate(0,3)     B3=candidate(1,2)
A4=candidate(4,4)     B4=candidate(5,5)
A5=candidate(4,6)     B5=candidate(5,7)
A6=candidate(4,5)     B6=candidate(5,4)
A7=candidate(4,7)     B7=candidate(5,6)
           C0=candidate(2,2)     D0=candidate(3,3)
           C1=candidate(2,0)     D1=candidate(3,1)
           C2=candidate(2,3)     D2=candidate(3,2)
           C3=candidate(2,1)     D3=candidate(3,0)
           C4=candidate(6,6)     D4=candidate(7,7)
           C5=candidate(6,4)     D5=candidate(7,5)
           C6=candidate(6,7)     D6=candidate(7,6)
           C7=candidate(6,5)     D7=candidate(7,4)

calculating, FOREACH i in 0..7
states_out[i] = (MIN(A<i>,B<i>,C<i>,D<i>))&0xff
if(states_out[i]==A<i>) decisions[i] =0     | MSB(A<i>)
if(states_out[i]==B<i>) decisions[i] =0x44 | MSB(B<i>)
if(states_out[i]==C<i>) decisions[i] =0x28 | MSB(C<i>)
if(states_out[i]==D<i>) decisions[i] =0x6C | MSB(D<i>), wherein MIN is defined as a value X out of a, b, c, and d for which WHICHMIN (X,Y) is 0 for all Y not equal to X in {a,b,c,d}, wherein WHICHMIN (a,b) is defined as if ((a−b)&0x80) then 0, otherwise 1, wherein & is bitwise AND, wherein MSB (a) is the most significant bit of (a);

loading eight output state metrics into a set of state registers, wherein each output state metric is represented by states_out[i];

outputting eight 8-bit decision values, wherein each decision value includes:
a bit 0, wherein bit 0 is a value for reconstruction of the upper bits of final state metrics;
bits 2 . . . 3, wherein bits 2 . . . 3 is a value for encoding the path selected for state <i> in this decode step; and
bits 4 . . . 5, wherein bits 4 . . . 5 is a value for calculating bits u1 and u2 of the symbol which are most likely if the encoder was in state <i>.

2. The execution unit of claim 1, wherein said set of Viterbi decoding instructions use modulo arithmetic to avoid the necessity to rescale state metrics.

3. A method for performing a Viterbi decoding algorithm, comprising:

(a) putting input metrics into one or more input registers;
(b) putting state metrics into one or more state registers;
(c) calculating new state metrics;
(d) calculating decision values;
(e) writing new state metrics into one or more state registers; and
(f) outputting a set of decision values, wherein steps (c), (d), (e) and (f) further comprise issuing one or more AVIT instructions, wherein said AVIT instruction comprises:

receiving eight input metrics and eight state metrics, wherein an input metric is represented as input_metrics [j], wherein a state metric is represented as states_in[i];
calculating candidates(i,j)=(states_in[i]+input_metrics [j]), wherein candidates (i,j) is a nine bit value, wherein

```
A0=candidate(0,0)   B0=candidate(1,1)   C0=candidate(2,2)   D0=candidate(3,3)
A1=candidate(0,2)   B1=candidate(1,3)   C1=candidate(2,0)   D1=candidate(3,1)
A2=candidate(0,1)   B2=candidate(1,0)   C2=candidate(2,3)   D2=candidate(3,2)
A3=candidate(0,3)   B3=candidate(1,2)   C3=candidate(2,1)   D3=candidate(3,0)
A4=candidate(4,4)   B4=candidate(5,5)   C4=candidate(6,6)   D4=candidate(7,7)
A5=candidate(4,6)   B5=candidate(5,7)   C5=candidate(6,4)   D5=candidate(7,5)
A6=candidate(4,5)   B6=candidate(5,4)   C6=candidate(6,7)   D6=candidate(7,6)
A7=candidate(4,7)   B7=candidate(5,6)   C7=candidate(6,5)   D7=candidate(7,4)
    calculating, FOREACH i in 0..7
    states_out[i] = (MIN(A<i>,B<i>,C<i>,D<i>))&0xff
    if(states_out[i]==A<i>) decisions[i] =0     | MSB(A<i>)
    if(states_out[i]==B<i>) decisions[i] =0x44 | MSB(B<i>)
    if(states_out[i]==C<i>) decisions[i] =0x28 | MSB(C<i>)
    if(states_out[i]==D<i>) decisions[i] =0x6C | MSB(D<i>),
``` wherein MIN is defined as a value X out of a, b, c, and d for which WHICHMIN (X,Y) is 0 for all Y not equal to X in {a,b,c,d}, wherein WHICHMIN (a,b) is defined as if ((a−b)&0x80) then 0, otherwise 1, wherein & is bitwise AND, wherein MSB (a) is the most significant bit of (a);

loading eight output state metrics into a set of state registers, wherein each output state metric is represented by states_out[i];

outputting eight 8-bit decision values, wherein each decision value includes:

a bit 0, wherein bit 0 is a value for reconstruction of the upper bits of final state metrics;

bits 2 . . . 3, wherein bits 2 . . . 3 is a value for encoding the path selected for state <i> in this decode step; and bits 4 . . . 5, wherein bits 4 . . . 5 is a value for calculating bits u1 and u2 of the symbol which are most likely if the encoder was in state <i>.

4. A method of performing Viterbi decoding, comprising:

receiving eight input metrics and eight state metrics, wherein an input metric represented as input_metrics [j], wherein a state metric is represented as states_in[i];

calculating candidates(i,j)=(states_in[i]+input_metrics [j]), wherein candidates (i,j) is a nine bit value, wherein a bit 0, wherein bit 0 is a value for reconstruction of the upper bits of final state metrics;

bits 2 . . . 3, wherein bits 2 . . . 3 is a value for encoding the path selected for state <i> in this decode step; and bits 4 . . . 5, wherein bits 4 . . . 5 is a value for calculating bits u1 and u2 of the symbol which are most likely if the encoder was in state <i>.

5. The method of claim 4, wherein said outputting of bits 4 . . . 5 of each decision value comprises 'exclusive-or'ing bits 4 . . . 5 with a value in a constant table indexed by <i>.

6. A method for decoding a codeword involving received over an ADSL communications channel, comprising:

(a) supplying an execution unit with input metrics;

(b) issuing a first AVIT instruction, wherein the first AVIT instruction includes states 0 through 7 and input metrics 0 through 7, wherein states 0 through 7 correspond to state values of 0, 4, 8, 12, 1, 5, 9 and 13, and wherein input metrics 0 through 7 correspond to input values 2, 6, 0, 4, 3, 7, 1 and 5;

(c) issuing a second AVIT instruction, wherein the second AVIT instruction includes states 8 through 15 and input metrics 8 through 15, wherein states 8 through 15 correspond to state values of 2, 6, 10, 14, 3, 7, 11 and

```
A0 = candidate(0,0)   B0 = candidate(1,1)   C0 = candidate(2,2)   D0 = candidate(3,3)
A1 = candidate(0,2)   B1 = candidate(1,3)   C1 = candidate(2,0)   D1 = candidate(3,1)
A2 = candidate(0,1)   B2 = candidate(1,0)   C2 = candidate(2,3)   D2 = candidate(3,2)
A3 = candidate(0,3)   B3 = candidate(1,2)   C3 = candidate(2,1)   D3 = candidate(3,0)
A4 = candidate(4,4)   B4 = candidate(5,5)   C4 = candidate(6,6)   D4 = candidate(7,7)
A5 = candidate(4,6)   B5 = candidate(5,7)   C5 = candidate(6,4)   D5 = candidate(7,5)
A6 = candidate(4,5)   B6 = candidate(5,4)   C6 = candidate(6,7)   D6 = candidate(7,6)
A7 = candidate(4,7)   B7 = candidate(5,6)   C7 = candidate(6,5)   D7 = candidate(7,4)
    calculating, FOREACH i in 0 . . . 7
    states_out[i]= (MIN(A<i>, B<i>, C<i>, D<i>))&0xff
    if(states_out[i] == A<i>) decisions[i] = 0       |MSB(A<i>)
    if(states_out[i] == B<i>) decisions[i] = 0x44   |MSB(B<i>)
    if(states_out[i] == C<i>) decisions[i] = 0x28   |MSB(C<i>)
    if(states_out[i] == D<i>) decisions[i] = 0x6C   |MSB(D<i>),
``` wherein MIN is defined as a value X out of a, b, c, and d for which WHICHMIN (X,Y) is 0 for all Y not equal to X in {a,b,c,d}, wherein WHICHMIN (a,b) is defined as if ((a−b)&0x80) then 0, otherwise 1, wherein & is bitwise AND, wherein MSB (a) is the most significant bit of (a);

loading eight output state metrics into a set of state registers, wherein each output state metric is represented by states_out[i];

outputting eight 8-bit decision values, wherein each decision value includes:

15, and wherein input metrics 0 through 7 correspond to input values 0, 4, 2, 6,1, 5, 3, and 7; and (d) outputting decision values to select a codeword as the transmitted codeword, wherein said AVIT instruction comprises:

receiving eight input metrics and eight state metrics, wherein an input metric is represented as input_metrics [j], wherein a state metric is represented as states_in[i];

calculating candidates(i,j)=(states_in[i]+input_metrics [j]), wherein candidates (i,j) is a nine bit value, wherein

```
A0=candidate(0,0)   B0=candidate(1,1)   C0=candidate(2,2)   D0=candidate(3,3)
A1=candidate(0,2)   B1=candidate(1,3)   C1=candidate(2,0)   D1=candidate(3,1)
A2=candidate(0,1)   B2=candidate(1,0)   C2=candidate(2,3)   D2=candidate(3,2)
A3=candidate(0,3)   B3=candidate(1,2)   C3=candidate(2,1)   D3=candidate(3,0)
A4=candidate(4,4)   B4=candidate(5,5)   C4=candidate(6,6)   D4=candidate(7,7)
A5=candidate(4,6)   B5=candidate(5,7)   C5=candidate(6,4)   D5=candidate(7,5)
A6=candidate(4,5)   B6=candidate(5,4)   C6=candidate(6,7)   D6=candidate(7,6)
A7=candidate(4,7)   B7=candidate(5,6)   C7=candidate(6,5)   D7=candidate(7,4)
    calculating, FOREACH i in 0..7
    states_out[i] = (MIN(A<i>,B<i>,C<i>,D<i>))&0xff
    if(states_out[i]==A<i>) decisions[i] =0     | MSB(A<i>)
    if(states_out[i]==B<i>) decisions[i] =0x44  | MSB(B<i>)
    if(states_out[i]==C<i>) decisions[i] =0x28  | MSB(C<i>)
    if(states_out[i]==D<i>) decisions[i] =0x6C  | MSB(D<i>),
``` wherein MIN is defined as a value X out of a, b, c, and d for which WHICHMIN (X,Y) is 0 for all Y not equal to X in {a,b,c,d}, wherein WHICHMIN (a,b) is defined as if ((a−b)&0x80) then 0, otherwise 1, wherein & is bitwise AND, wherein MSB (a) is the most significant bit of (a);

loading eight output state metrics into a set of state registers, wherein each output state metric is represented by states_out[i];

outputting eight 8-bit decision values, wherein each decision value includes:

a bit 0, wherein bit 0 is a value for reconstruction of the upper bits of final state metrics;

bits 2 . . . 3, wherein bits 2 . . . 3 is a value for encoding the path selected for state <i> in this decode step; and bits 4 . . . 5, wherein bits 4 . . . 5 is a value for calculating bits u1 and u2 of the symbol which are most likely if the encoder was in state <i>.

* * * * *